United States Patent
Foster et al.

(10) Patent No.: US 9,852,258 B1
(45) Date of Patent: Dec. 26, 2017

(54) METHOD AND SYSTEM FOR IMPLEMENTING A REQUIREMENTS DRIVEN CLOSED LOOP VERIFICATION COCKPIT FOR ANALOG CIRCUITS

(71) Applicant: Cadence Design Systems, Inc., San Jose, CA (US)

(72) Inventors: Paul C. Foster, Scotts Valley, CA (US); Walter E. Hartong, Isen (DE); Jinduo Sun, Beijing (CN)

(73) Assignee: Cadence Design Systems, Inc., San Jose, CA (US)

( * ) Notice: Subject to any disclaimer, the term of this patent is extended or adjusted under 35 U.S.C. 154(b) by 213 days.

(21) Appl. No.: 14/675,551

(22) Filed: Mar. 31, 2015

(51) Int. Cl.
*G06F 17/50* (2006.01)

(52) U.S. Cl.
CPC ...... *G06F 17/5081* (2013.01); *G06F 17/5036* (2013.01); *G06F 17/5063* (2013.01)

(58) Field of Classification Search
None
See application file for complete search history.

(56) References Cited

U.S. PATENT DOCUMENTS

| | | | |
|---|---|---|---|
| 5,761,079 A * | 6/1998 | Drumm | G06F 17/5045 716/102 |
| 6,026,220 A * | 2/2000 | Cleereman | G06F 17/5045 703/23 |
| 6,321,363 B1 * | 11/2001 | Huang | G06F 17/5022 703/16 |
| 6,832,358 B2 | 12/2004 | Foster et al. | |
| 7,516,423 B2 * | 4/2009 | De Smedt | G06F 17/505 716/123 |
| 8,209,650 B2 * | 6/2012 | St. John | G06F 17/5063 716/101 |
| 8,327,303 B1 | 12/2012 | Foster et al. | |
| 8,423,934 B1 | 4/2013 | Foster et al. | |
| 8,943,450 B1 | 1/2015 | Hartong et al. | |
| 8,996,339 B2 * | 3/2015 | Chockler | G06F 17/504 703/2 |
| 2005/0010598 A1 * | 1/2005 | Shankar | G06Q 10/06 |
| 2005/0257178 A1 * | 11/2005 | Daems | G06F 17/5045 716/51 |

* cited by examiner

*Primary Examiner* — Leigh Garbowski
(74) *Attorney, Agent, or Firm* — Vista IP Law Group, LLP

(57) ABSTRACT

Disclosed is an approach to implement a requirements-driven analog verification flow. Disparate islands of verification tasks are performed with individual cellviews to be set into an overarching and closed loop verification flow context for a project or a complex verification task.

20 Claims, 19 Drawing Sheets

| ID | Title | Goal | Min | Max | Owner | Description |
|---|---|---|---|---|---|---|
| SAD | Project "SomeAnalogDesign" | Note | | | Jim | This is the new project "SomeAnalogDesign" for customer XYZ. It is based on project ... |
| SAD1 | OpAmp | Note | | | | This is a classical OpAmp design as we use it all the time. |
| SAD1.1 | Analog Parametric AC Behavior | Spec Pass | | | Harry | Ensure the AC behavior |
| ID8 | Max AC gain | Spec Pass | | | Harry | The maximum AC gain |
| ID4 | DC Gain | Spec Pass | | | | DC Gain |
| ID3 | Input offset | Spec Pass | | | | Input random offset value |
| SAD1.2 | Analog Parametric Tran Behavior | Note | | | | Ensure correct tran beh. |
| ID2 | Max power consumption | Spec Pass | 6m | | Fred | Verify the max power consumption |
| ID5 | Settling time | Spec Pass | 21n | | Fred | Settling time |
| ID6 | Slew Rate | Spec Pass | | | Fred | Slew Rate |
| SAD1.3 | Functional tests | Ran OK | | | | Make sure that the block is functionally correct. |
| SAD1.4 | Power up behavior | Spec Pass | | | | Do a proper power up sim on full transitor level |
| SAD1.5 | Ensure Yield | Ran OK | | | | |
| ID13 | yield analysis | Note | | | | do yield analysis |
| SAD2 | Filter | Spec Pass | | | | The filter is a digital filter implementation using.... |
| SAD3 | Power Amp | Spec Pass | | | | Power amp for the output |
| SAD4 | VCO | Note | | | | VCO for the PLL of the SAD project which will be added later. |
| SAD4.1 | vcontrol/freqout beh | Spec Pass | | | | The output frequency of the VCO should be above the following limit: |
| SAD4.2 | max current | Spec Pass | 70m | | | The peak current limit is at 8m A |
| SAD4.3 | Power consumption | Spec Pass | | | | The power consumption of this block must be below 8m |
| SAD4.4 | PD behavior | Spec Pass | | | | The PD pin is active high. |
| SAD4.5 | Startup | Spec Pass | | | | The startup must happen after the first falling edge of PD |

| ID | Title | Mapped |
|---|---|---|
| ⊟ SAD | Project "SomeAnalogDesign" | |
| ⊟ SAD1 | OpAmp | |
| ⊟ SAD1.1 | Analog Parametric AC Behavior | Yes |
| ···· ID8 | Max AC gain | Yes |
| ···· ID4 | DC Gain | Yes |
| ···· ID3 | Input offset | No |
| ⊟ SAD1.2 | Analog Parametric Tran Behavior | Yes |
| ···· ID2 | Max power consumption | Yes |
| ···· ID5 | Settling time | Yes |
| ···· ID6 | Slew Rate | Yes |
| ···· SAD1.3 | Functional tests | No |
| ···· SAD1.4 | Power up behavior | No |
| ⊟ SAD1.5 | Ensure Yield | No |
| ···· ID13 | yield analysis | No |
| ···· SAD2 | Filter | Yes |
| ···· SAD3 | Power Amp | Yes |
| ⊟ SAD4 | VCO | No |
| ···· SAD4.1 | vcontrol/freqout beh | Yes |
| ···· SAD4.2 | max_current | Yes |
| ···· SAD4.3 | Power consumption | Yes |
| ···· SAD4.4 | PD behavior | Yes |
| ···· SAD4.5 | Startup | No |

Overall Status: 50%  FAIL

| Cell | Test | Output | Specification | Mapped |
|---|---|---|---|---|
| full_diff_opamp_AC | opamp090:full_diff_opamp_AC:1 | Bandwidth | None | 60% |
| | | Current | 0.007 within 6.0% | 80% |
| | | DCGain | >25.0 | No |
| | | Input Random Offset | <0.006 | ID3 |
| | | MAC_DCGain | <20.0 | ID4 |
| | opamp090:full_diff_opamp_TRAN:1 | Settling Time | <2e-08 | ID8 |
| | | Slew Rate | <1.25e+08 | SAD1.3 |
| | | avgOutN | None | ID5 |
| | | avgOutP | 0.9 to 0.95 | ID6 |
| | | ocnMeasure_0 | None | No |
| full_diff_opamp_AC_bad | opamp090:full_diff_opamp_AC:1 | Bandwidth | None | 10% |
| | | Current | <0.005 | 0% |
| | | DCGain | >25.0 | No |
| | | Input Random Offset | <0.005 | No |
| | | MAC_DCGain | <30.0 | No |
| | opamp090:full_diff_opamp_TRAN:1 | Settling Time | <2e-08 | 20% |
| | | Slew Rate | <2e+08 | No |
| | | avgOutN | None | ID6 |
| | | avgOutP | 0.9 to 0.95 | No |
| | | ocnMeasure_0 | None | No |
| PLL_VCO_320MHZ_tb | amsPLL:PLL_VCO_320MHZ_tb:1 | avg_current | <0.008 | 75% |
| | | freq | None | 75% |
| | | freq_check | 0.0 to 1.5e+08 | SAD4.1 |
| | | max_current | <0.07 | SAD4.2 |
| PLL_VCO_320MHZ_PD_tb | amsPLL:PLL_VCO_320MHZ_PD_tb:1 | avg_current | <0.0008 | 100% |
| | | outout_low | 1.8 to 2.1 | 100% |
| | | | | SAD4.4 |
| | | | | SAD4.4 |

Map

FIG. 3E

| ID | Title | Overall Status | | Information | |
|---|---|---|---|---|---|
| ⊟-SAD | Project "SomeAnalogDesign" | 50.0% | | Requirement ID | SAD->SAD1->SAD1.2->ID6 |
| ⊟-SAD1 | OpAmp | 55.6% | | Requirement Title | Slew Rate |
| ⊟-SAD1.1 | Analog Parametric AC Behavior | 100.0% | | Requirement Goal Type | Spec Pass |
| ┆--ID8 | Max AC gain | Pass | | Requirement Status | Fail |
| ┆--ID4 | DC Gain | Pass | | Outputs Passed | 1 |
| ┆--ID3 | Input offset | Pass | | Outputs Failed | 1 |
| ⊟-SAD1.2 | Analog Parametric Tran Behavior | 33.3% | | Outputs Not Run | 0 |
| ┆--ID2 | Max power consumption | Not Mapped | | Cellview | opamp090:full diff opamp AC/adexl/Active |
| ┆--ID5 | Settling Time | Pass | | Test | opamp090:full diff opamp_TRAN:1 |
| ┆--ID6: | Slew Rate | Fail | | Output | Slew Rate |
| ┆--SAD1.3 | Functional tests | Pass | | Specification Status | Pass |
| ┆--SAD1.4 | Power up behavior | Not Mapped | | Specification | >125M |
| ┆--SAD1.5 | Ensure Yield | 0.0% | | Min Value | 178.913M |
| ┆--ID13 | yield analysis | Not Mapped | | Min Value Parameters | corner=C1 |
| ┆-SAD2 | Filter | Not Mapped | | Max Value | 178.913M |
| ┆-SAD3 | PowerAmp | Not Mapped | | Max Value Parameters | corner=C1 |
| ⊟-SAD4 | VCO | 60.0% | | Specification Fails | 0 failed out of 1 |
| ┆--SAD4.1 | vcontrol/freqout beh | Fail | | Cellview | opamp090:full diff opamp AC bad/adexl/Active |
| ┆--SAD4.2 | max_current | Pass | | Test | opamp090:full diff opamp_TRAN:1 |
| ┆--SAD4.3 | Power consumption | Pass | | Output | Slew Rate |
| ┆--SAD4.4 | PD behavior | Pass | | Specification Status | Fail |
| ┆--SAD4.5 | Startup | Not Mapped | | Specification | >200M |
| | | | | First Fail Parameters | corner=C1 |
| | | | | Min Value | 172.946M |
| | | | | Min Value Parameters | corner=C1 |
| | | | | Max Value | 172.946M |
| | | | | Max Value Parameters | corner=C1 |
| | | | | Specification Fails | 1 failed out of 1 |

//

METHOD AND SYSTEM FOR IMPLEMENTING A REQUIREMENTS DRIVEN CLOSED LOOP VERIFICATION COCKPIT FOR ANALOG CIRCUITS

BACKGROUND

The invention is directed to an improved approach for designing, analyzing, and manufacturing integrated circuits.

An integrated circuit (IC) has a large number of electronic components, such as transistors, logic gates, diodes, wires, etc., that are fabricated by forming layers of different materials and of different geometric shapes on various regions of a silicon wafer. Many phases of physical design may be performed with computer aided design (CAD) tools or electronic design automation (EDA) systems. To design an integrated circuit, a designer first creates high level behavior descriptions of the IC device using a high-level hardware design language. An EDA system can be used to take the high level behavior descriptions of the IC device and to generate one or more netlists for the electronic design. A netlist describes, for example, interconnections of nodes and components on the chip and includes information of circuit primitives such as transistors and diodes, their sizes and interconnections. After an integrated circuit designer has created the physical design of the circuit, the integrated circuit designer then verifies and optimizes the design using a set of EDA testing and analysis tools.

Circuit designs may include digital circuitry, analog circuitry, or a combination of both analog and digital portions. Specialized tools often need to be used to perform verification tasks for each of these types of circuits. For example, verification of digital circuit designs is often performed by EDA tools that are specifically configured to operate upon digital designs.

The issue addressed by the present disclosure is that analog verification does not have formalized methods, tools and flows that, for digital verification, have evolved over many years. It is not possible to apply the digital verification methods to the analog problem as the analog and digital verification problem are fundamentally different in the details.

One approach that has been taken to verify analog circuits is to use cellviews. A cellview is a basic unit of design data represented as a file in a library. The cellview can be created to include any number of tests which reference that cell and/or other cells. An example approach to implement cellviews is provided by an analog design environment, which provides capabilities to explore, analyze, and verify a design against the user's desired goals.

Conventionally, cellviews are used in a self-contained approach for verification, where individual cellviews are used in distinct analog islands within the overall design. The drawback with this approach is that it cannot be easily adopted for other and more complex verification purposes (e.g., ones that extend beyond the self-contained capabilities within the individual cellview). This means that the analog aspects of a complete verification plan (e.g., SoC (system on chip) verification plan) cannot be connected into the cellviews of analog design environments. As a result, it is not possible with conventional tools to obtain a complete picture of the dynamic or final status of verification of all of the blocks within the design.

With conventional tools, the analog parts of the design are often verified in an ad-hoc manner based on the potentially limited information available to, and the skills of, the analog designer. The analog design, the designer, and the test benches that are used to simulate the design, are trapped in analog islands within the digitally verified SoC. For complex verification tasks it is essential that the verification goal and requirements are predefined in a formalized manner. These drawbacks severely limit the scalability and flexibility for performing analog verification when using cellviews.

Therefore, it is clear that there is a need for an improved approach to perform verification of analog circuit designs.

SUMMARY

Some embodiments provide a method and mechanism to implement a requirements-driven analog verification flow. This allows disparate islands of verification tasks performed with individual cellviews to be set into an overarching and closed loop verification flow context for a project or a complex verification task. High level verification requirements can be captured for the flow by designers familiar with the product to be created, even if they do not have intimate knowledge of the intricacies of the underlying cellviews. A mapping structure is provided to apply those requirements to any number of disparate analog verification tasks (e.g. cellviews). This permits an overall control over a series of steps to carry out any level of complexity for verification tasks.

Other and additional objects, features, and advantages of the invention are described in the detailed description, figures, and claims.

BRIEF DESCRIPTION OF FIGURES

FIG. 3A-E illustrate example interfaces for the verification cockpit according to some embodiments.

DETAILED DESCRIPTION

The present invention provides a method and mechanism to implement a requirements-driven analog verification flow. Embodiments of the invention allow disparate islands of verification tasks (performed with individual cellviews) to be set into an overarching and closed loop verification flow context for a project or a complex verification task. High level verification requirements (including but not limited to specifications values) can be captured for the flow by designers familiar with the product to be created, even if they do not have intimate knowledge of the intricacies of the underlying cellviews. A mapping structure is provided to apply those requirements to any number of disparate analog verification tasks (e.g. cellviews). This permits an overall control over a series of steps to carry out any level of complexity for verification tasks. The cockpit enables analog verification engineers to close the loop from the verification plan, via the implementation of the verification tasks, to the results and making modifications to the plan and implementations until the plan and implementations are fully matched and everything is working as expected.

For purposes of illustration only, and not by way of limitation, some of the embodiments below may be described in the context of cellviews. It is noted, however, that the inventive techniques described herein are applicable to any verification implementations that are carried out at low granular levels. Therefore, the invention is not limited in its scope to any specific tools unless specifically claimed as such. In addition, while the below description is directed to analog verification, it is noted that the concepts described herein are also applicable without limitation to analog-mixed signal and digital verification as well.

Figure 1:
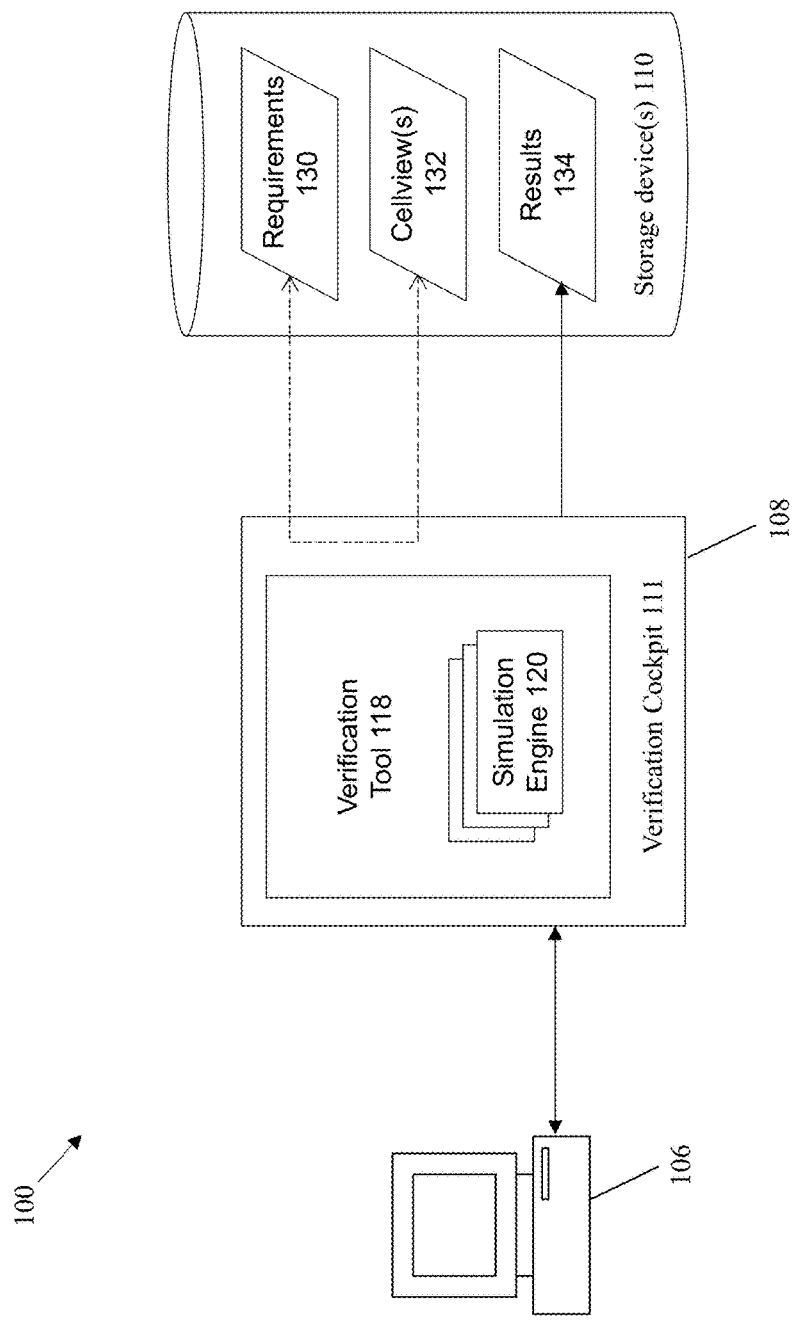
FIG. 1 provides a high level illustration of a system 100 to implement some embodiments of the invention.

FIG. 1 provides a high level illustration of a system 100 to implement some embodiments of the invention. System 100 may include one or more users at one or more user station(s) 106 that operate the system 100 to design or verify the electronic designs. Such users include, for example, design engineers or verification engineers. User station 106 comprises any type of computing station that may be used to operate, interface with, or implement EDA applications or devices, such as EDA (electronic design automation) tool at server 108. Examples of such user stations 106 include for example, workstations, personal computers, or remote computing terminals. User station 106 comprises a display device, such as a display monitor, for displaying electronic design analysis results to users at the user station 106. User station 106 also comprises one or more input devices for the user to provide operational control over the activities of system 100, such as a mouse or keyboard to manipulate a pointing object in a graphical user interface.

The users at user station 106 may generate a set of requirements 130 to be operated upon by verification tool 118. A verification cockpit 111 provides a bridge from the formal verification plans that then connect into the self-contained cellviews 132. This bidirectional bridge allows the analog verification status of cellviews 132 operated by the verification tool 118 to be viewed within the context of the requirements 132 from outside of the verification tool 118.

The present system 100 can therefore take the disparate islands of verification/simulation represented by individual cellviews 132, and knit them together into an overarching verification flow that maps to the requirements 130. This permits an overall control over a series of steps to be carried out by one or more simulation engines 120 to perform any level of complexity for verification tasks. As a result, a top down requirements driven closed verification loop can be implemented that can be fully encapsulated into a single regression script to be run by digital verification teams. The encapsulated regression script allows engineers who are not analog experts to execute analog verification and view requirements status in reports and web pages.

According to some embodiments, the EDA tool and its data are organized in terms of libraries, where there are several system-wide libraries that hold generic parts such as transistors, resistors, and-gates, and/or gates. These libraries may also include other items of design data, such as schematics, layouts, and/or HDL code. A given library may include objects that are referred to as the cellview 132. For instance, one have a library called "parts" that includes a cellview called "MUX_Type_A" for a certain type of multiplexer. Each cellview may have one or more views associated with it, that form a view of the part/object. For instance, one may implement a schematic view as a physical schematic of the part, a symbol view that corresponds to a part of a schematic, and/or a functional view corresponding to a Verilog description of the part. When one simulates a design, the view includes information that is usable by a simulator to simulate that particular cellview.

The verification/simulation results 134, requirements 130, and/or cellviews 132 may be stored in one or more computer readable storage device(s) 110. Any design corresponding to any form of electrical design data may also be stored in the computer readable storage device(s) 110, including for example, MCMM (multi-corner, multi-mode) configurations, timing properties, Verilog data, LEF/DEF data files, and/or scripts. Computer readable storage device 110 includes any combination of hardware and/or software that allows for ready access to the data that is located at the computer readable storage device 110. For example, computer readable storage device 110 could be implemented as computer memory operatively managed by an operating system. The computer readable storage device 110 could also be implemented as an electronic database system having storage on persistent and/or non-persistent storage.

Figure 2:
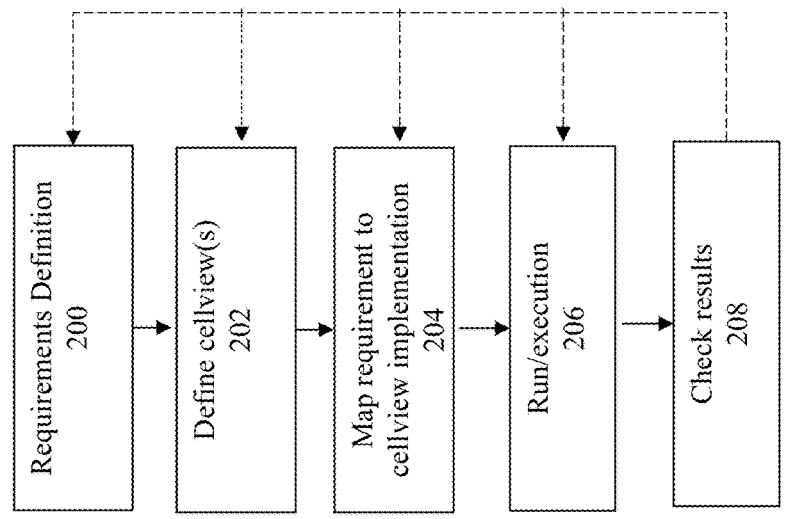
FIG. 2 shows a flowchart of an approach that can take disparate islands of analog verification/simulation provided by individual cellviews, and knit them together into an overarching verification flow that hooks everything together.

FIG. 2 shows a flowchart of an approach that can take disparate islands of analog verification/simulation provided by individual cellviews, and knit them together into an overarching verification flow that hooks everything together.

The process operates, at 200, by performing a requirements definition stage, where the requirements/specifications are defined. High level verification requirements/specifications can be implemented for the flow by designers familiar with the product to be created, even if they do not have intimate knowledge of the intricacies of the underlying analog cellviews. The specification can be imported from any suitable document format, such spreadsheet document formats or text document formats.

At 202, one or more low level implementations are defined (e.g., cellviews). The cellviews include any parameter or information that is pertinent to verification functionality required by that cellview. Such information includes, for example, variables, parameters, testbench data, MCMM information, corner data, scripts/code (e.g., skill code), sweeps, and/or any other information deemed useful or necessary to perform verification.

At 204, mapping is performed between one or more portions of the specification and one or more low level implementations of the cellviews. A mapping structure can be provided to apply the requirements/specifications to any number of disparate cellviews. This permits an overall control over a series of steps to carry out any level of complexity for verification tasks. In some embodiment, mapping is accomplished by creating an XML file for the cellview, and including an identifier for specific requirement into the appropriate filed of the XML file for the cellview. Alternative approaches can also be taken to implementing the mapping functionality. For example, a separate mapping table can be maintained to track the associations from the requirements to the cellviews.

At 206, verification is performed by running one or more verification plans. A verification plan is an executable flow that includes running of the various cellviews (mapped from/to one or more requirements). The verification plan can be run in a defined order in some embodiments. The verification plan is run to determine overall plan and/or individual pass/fail for the requirement. As described in more detail below, workflow-based flows can be defined, where the flows correspond to multiple cellviews can describe execution paths, conditionals, and/looping behavior for the runs.

At 208, results are reviewed for the previous executions. For example, an overall percentage of verification completeness/pass & fail can be made available based on what has been run/simulated/measured within the specifications. Presentation of results in some embodiments can also include high level viewing of results, connections to simulation tools for debug/details, and/or creation of reports in various formats for use in design reviews.

The results can be analyzed and used to repeat any of the above actions as necessary or desired to further the verification process. For example, the process may loop back to modify any aspects of the specifications, cellviews, mappings, and/or execution parameters. A verification loop is therefore implemented, involving: planning→implementation→mapping→execution/running→check results vs. plan (% done)→change/enhance plan, change/enhance implementation and/or assume verification to the done.

This approach is iterative, repeatable and bidirectional, where external abstract requirements are identified, are mapped, run, verified, and then reports/information/data proceeds back out/up again into the overall system.

As is clear, one of the key advantages to embodiments of the invention is the ability to wrap abstract higher levels of requirements to cellview-based verification objects (or their equivalents). It is this capability that enables requirements-driven analog verification. In analog today there are a set of very well defined requirements—the specification values. These include, for example, gain, power consumption, operating frequency, etc. These values are very clearly stated in the specification document/data sheet. It is not a major problem to track these—one can perform this type of tracking in a spreadsheet. However, there is a large set of "hidden" and/or "assumed" requirements that are—today—not very well spelled out in most flows. Experienced analog designers "know" these things. For example, an experienced designer may need to over-design one or more of the specification values to provide enough buffer for tolerances, or that a certain noise level must be below a certain threshold, or that all the transistors need to be in a linear region, etc. It is a great improvement for analog groups and engineers if these extra verification requirements are documented and tracked properly/formally by adding this detailed knowledge from the experienced analog designer back up into the overall plan for later use, as is possible using the present invention.

Some embodiments provide a graphical approach to implement planning, running, and setups, and/or monitoring. With a graphical interface, the user can graphically describes the sequence of simulations to be run, their dependencies, looping/iteration and conditions (based at least in part on run status and measured result checking). This graphical setup can be run interactively from the GUI (graphical user interface) or fully from the regression script. This enables complex simulation flows to be defined without having to resort to learning and using and maintaining complex scripting languages. The graphical setup also provides monitoring and debug environment that can be used while the simulation flow is bring run.

FIG. 3A illustrates an example interface 300 for the verification cockpit to display/define the specifications according to some embodiments. This interface 300 permits capture of analog verification requirements in a formalized manner that facilitates the overall verification flow. The verification requirements include specification values as well as requirements such as functional requirements, implied or 'common sense' assumptions, experiences from earlier projects etc. In some embodiments, the verification requirement capturing process is iterative so that the plan can be refined over time.

As illustrated in interface portion 302, the requirements are arranged in a tree view that allows users to define their inter-relationship, order and dependencies and structure. The same tree can be used to show detailed and overall status. This interface uses unique identifiers for requirements for easy access/query. Requirements can optionally have a parent and any number of children to categorize and group together related requirements. Notes and/or descriptions for the requirements are displayed in interface portion 304.

Figure 3B:
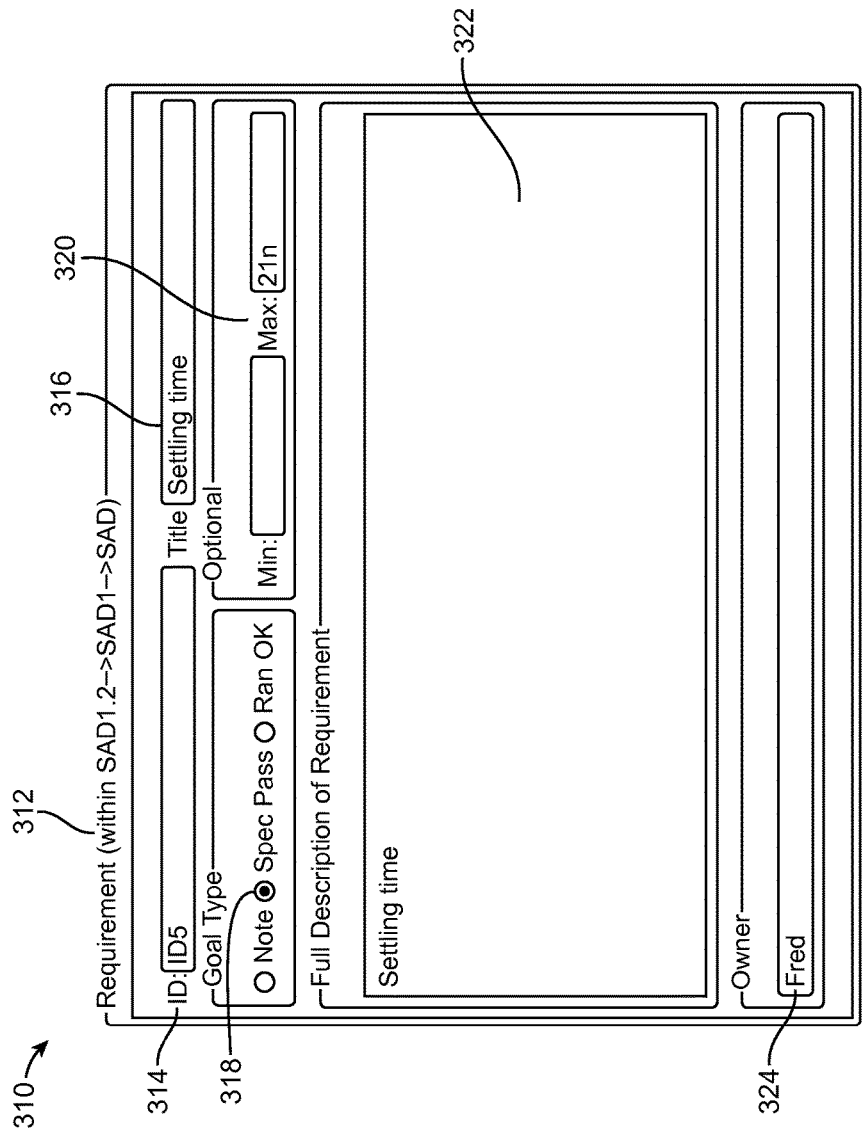

FIG. 3B illustrates an example interface 310 for editing/defining the pertinent details of each requirement. Each requirement may include some or all of the following: a unique ID, a goal type (e.g. pass/fail, ran OK, note, manual, etc. that defines the objective of the requirement), a title, a multi-line description, owner, min and max limits, and/or units. Interface portion 312 of the interface 310 identifies the requirements hierarchy for the verification requirement currently being edited. Interface portion 314 corresponds to the unique identifier (ID) for the requirement. Interface portion 316 corresponds to the title of the requirement. Interface portion 318 corresponds to the analog goal type. Interface portion 320 corresponds to the specification limits. Interface portion 322 corresponds to a description for the requirement. Interface portion 324 identifies the owner of the requirement.

As noted above, a mapping stage is performed to map the items in the requirements tree view to the implementations (e.g., cellviews, tests, and/or outputs). This permits a correspondence to be defined between the content of individual cellviews and the high level steps that are to be operated upon to perform verification. It is this mapping capability that connects the analog verification environment into the top-down requirements driven planning approach/view.

FIG. 3C illustrates an example interface 340 that can be used to implement this type of mapping. Interface portion 342 provides a view of the requirements, where the tree-based nature of this view allows the tool to visually display the inter-relationship, order, dependencies and/or structure of the dependencies. Interface portion 344 identifies the cellview implementations that have been defined in the system for the requirements.

Control element 346 is employed to initiate mapping of a specific requirement to a specific implementation. In operation, this occurs by user selection of a requirement from interface portion 342, user selection of an implementation from interface portion 344, and then activation of control element 346. This causes the ID associated with the selected requirement to be mapped to the ID associated with the selected implementation. In some embodiment, this action is performed by including the ID for the selected requirement into the file representation of the implementation, e.g., as a field in an XML file associated with the implementation. Alternatively, a mapping table can be updated to associate the ID of the selected requirement to the selected implementation.

Visual indicators can be provided to indicate the mapping status of the individual requirements in the interface portion 342. For example, a "Mapped" column can be provided in interface portion 342 that includes either "Yes" (to indicate that the corresponding requirement is mapped) or "No" (to indicate that the requirement is unmapped). Color coding visuals may also be employed in the interface, where a certain color (e.g., green) indicates that a given requirement is mapped while another color (e.g., red) indicates that the requirement is yet unmapped. The interface 340 may also include a color bar interface 348, which visually identifies the overall progress, using color coding and/or with text to indicate the overall progress.

Interface portion 344 may include multiple columns/sections of data regarding the implementations. For example, interface portion 344 may include a first column to identify the cellview, a second column to identify the test, a third column to identify output data, a fourth column to identify data for the corresponding specification, and a fifth column to identify mapping status and percentage.

Figure 3D:
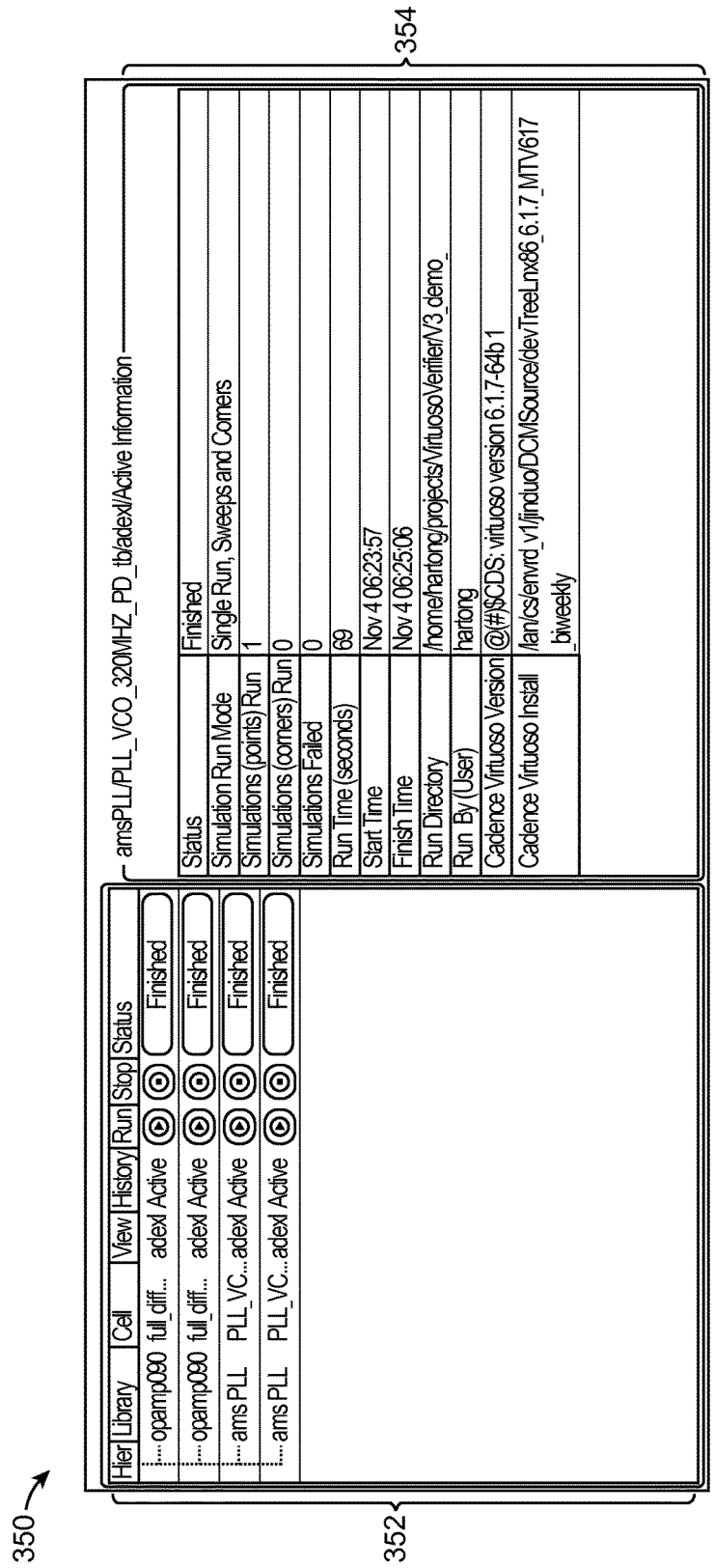

FIG. 3D shows an example interface 350 to run/execute the verification loop that was previously set-up by the mappings. This interface includes an interface portion 352 to identify the different cellviews to be run, showing information about the library, cell, view, status, and run status. Interface portion 354 shows information about the cellview that was run, including status information, simulation run mode, simulation (points) run, simulation (corners) run, simulations failed, run time, start time, end time, run directory, user ID, and data about the verification tool. In some embodiments, these cellviews can configured as separate actions to be taken, albeit part of the overall verification loop for the requirements shown in the previous interface figures. In an alternate embodiment, these cellviews can be configured to be sub-plans within a larger overall master plan.

FIG. 3E shows an example interface 360 to display results to a user. The interface permits the results of the simulations and verifications to be correlated (mapped) to the hierarchical plan that was entered upfront. The hierarchal plan is displayed in interface portion 362 and results information is displayed in interface portion 364. This approach provides the tool with the ability to measure the status of the verification, e.g. in a percentage of requirement goals achieved. This is a new concept which would not be possible without the formal capturing of verification goal and implementation results in one tool. In addition, this flow allows the user to review if everything works according to the plan. If not, the user can then react appropriately (e.g., either by changing the design, the plan, the test setup or the specifications).

Figure 4:
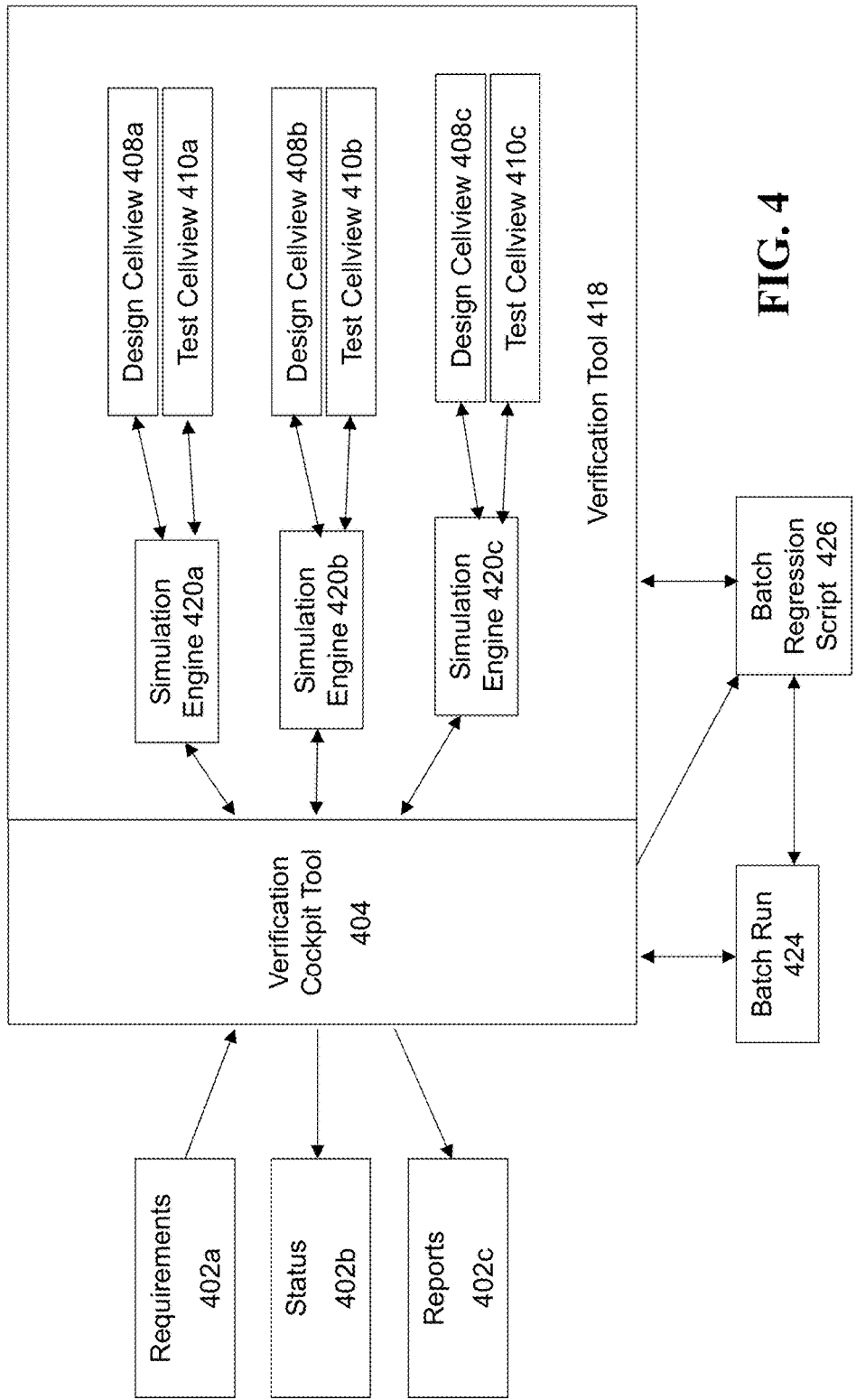
FIG. 4 provides a more detailed figure of an architecture for implementing some embodiments of the invention.

FIG. 4 provides a more detailed figure of an architecture for implementing some embodiments of the invention. A verification cockpit/layer 404 sits above and around a base verification tool 418. The verification layer provides functionality to run tests and simulations using the verification tool 418. In addition, this layer 404 correlates requirements to tests and measurements. Planning & results tracking may also be performed with layer 404. This layer 404 also provides interactive and batch run, as well as up-abstracting complex setup/results.

From an implementation point of view, the system architecture maps high level abstract requirements into 'real' tangible designs, tests, measurements and specs. This provides either a 'meet in the middle' methodology when using existing test benches or a 'top-down' methodology where the requirements provide information that enables the expert analog designer to accurately construct the tests that match the requirements objectives.

Using the verification layer 404, a user enters or imports verification requirements 402a, e.g., to check propagation delay, ensure power consumption is within limits for all conditions, and/or other types of requirements. If the appropriate cellview (e.g., test 410a-c or measurement 408a-c) does not already exist to test and measure the requirement, then one or more new tests and measurements are created for the requirement 402a. Mappings are then made to correlate requirements 402a to the cellview, test or measurement names. This information is saved to a database for later use.

The test bench simulations are then run by the verification tool 418. In some embodiments, multiple simulation engines 420a-c may be used to perform the simulations. The simulations can therefore be executed concurrently using multiple processing entities, e.g., processors, processes, cores, tasks, and/or network nodes.

The system converts the measured simulation results to generate specification pass/fail coverage data. Status information 402b can be provided throughout the process. In addition, reports 402c can be made available for the intermediate and final simulation results. A user can use the status information and/or reports to evaluate the overall requirement pass/fail from the actual simulation run measurement pass/fail data that are mapped.

In some embodiments, these can be encapsulated into a single batch script 426 to send commands to execute/re-execute the process (using batch runs 424) on a machine farm on a regular basis (e.g., nightly) to detect and highlight failures.

In some embodiments, the regression scripts are automatically generated. This is implemented for example, by having some and/or all of the interactive setup steps to be saved as a re-executable regression script. These scripts can be run on a regular basis to re-confirm the validation status, e.g., to detect designs failing validation. The significant benefit is that analog verification is normally a very 'hands on' and interactive process. By creating a batch repeatable process to repeat what would normally be manual steps in a GUI, this enables the encapsulated verification scripts to non-interactively re-execute regularly without manual intervention and detect design, requirement or test changes that cause failures.

This approach therefore enables iterative, repeatable and bidirectional communication and data conversion between requirements/plans, implementation tools & engines. This also provides regression creation, running and dynamic monitor features for analog designs within a verification tool 418.

Some embodiments provide the ability to implement a multi-user collaborative flow and requirement references. This permits a project leader to allocate requirements for a project to different users. The system auto-creates setups for those users and then cross links and/or creates references between the different setups so that the project leader and individual users can collaborate and progress towards a complete working verification plan.

Figure 5:
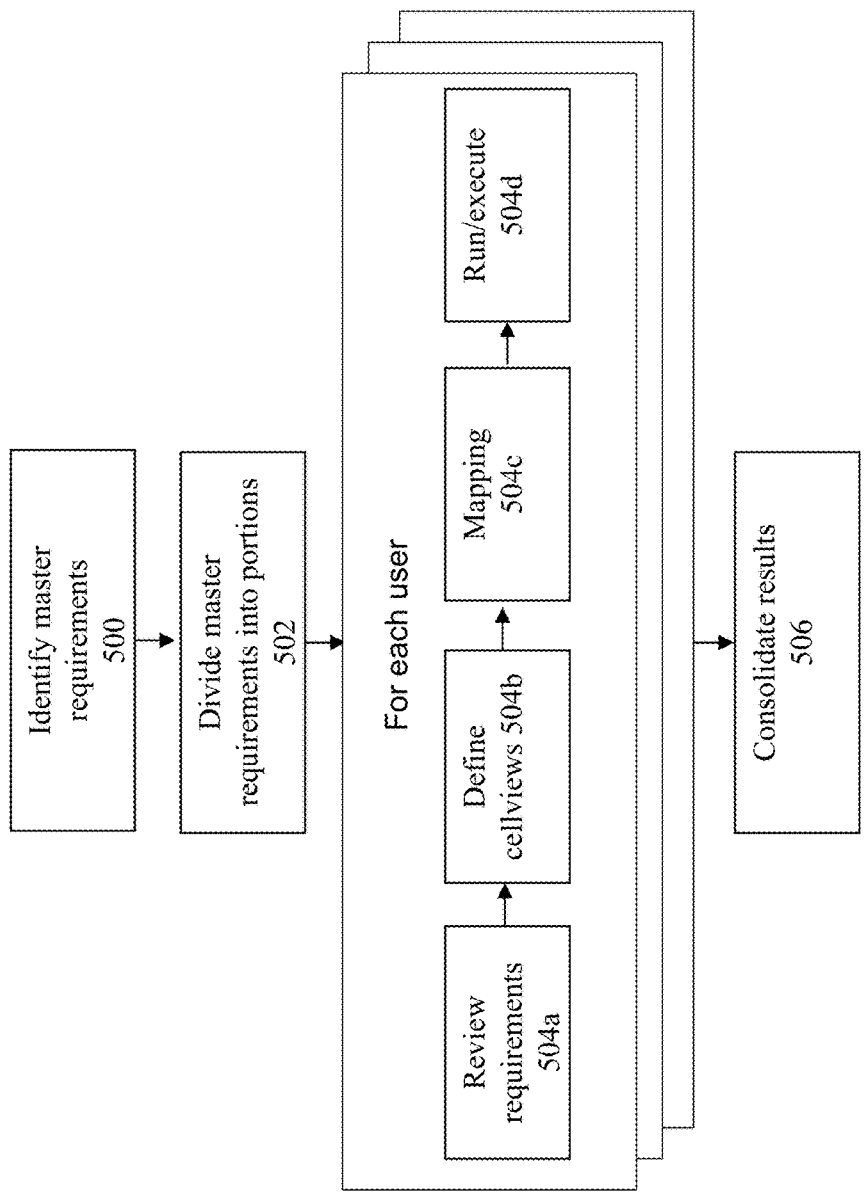
FIG. 5 shows a flowchart of an approach to implement a multi-user collaborative flow.

FIG. 5 shows a flowchart of an approach to implement a multi-user collaborative flow. At 500, a set of master requirements are identified. For example, a manager or project leader that intends to delegate a set of requirements his employees may define a master set of requirements to be delegated for a project.

At 502, the master set of requirements is divided into smaller portions. Each of the smaller sets of requirements can be assigned to a different user. However, each of the individual requirements within the divided sets of requirements are nonetheless still linked to the master set of requirements. This cross-linking ensures that as individual users make progress on their individual sets of requirements, that the results are made available to others through the requirements linking.

The individual user can then proceed to process the smaller sets of requirements assigned to these users. Any of the techniques described above may be performed by the user to process the set of requirements assigned to that user. For example, at 504a, the requirements assigned to that user are reviewed. At 504b, the user may need to define one or more cellview implementations. At 504c, the user will map the requirements to the cellview implementations. At 504d, simulations can be run for the design portions assigned to the user.

Thereafter, at 506, the results for each user can be consolidated and viewed as part of the whole set of results for the master requirements. The cross-linking permits the project leader and the individual users to collaboratively work on the requirements and progress towards a complete working verification plan.

Figure 6A:
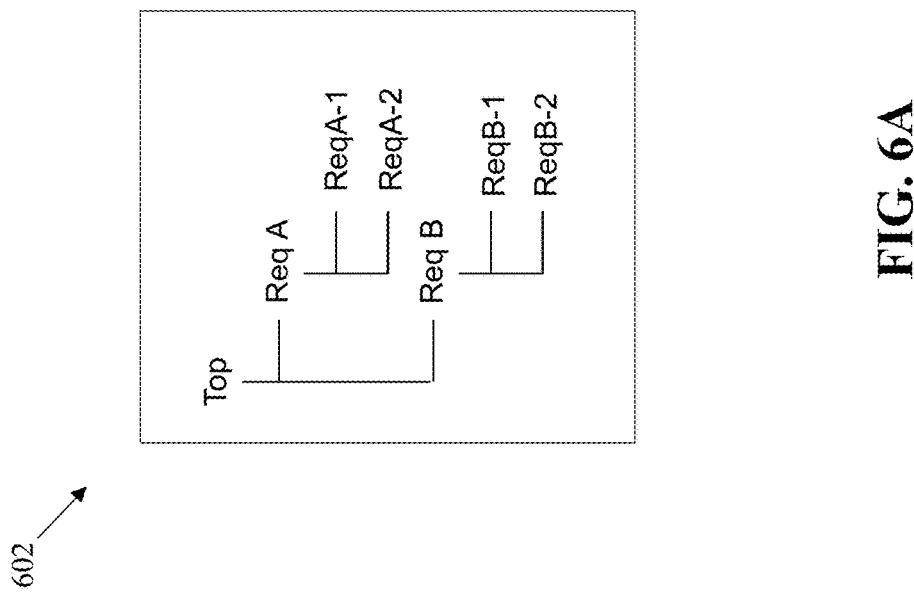
FIGS. 6A-D illustrate an approach to implement a multi-user collaborative flow.

FIGS. 6A-D illustrate this process. FIG. 6A shows an example set of requirements represented as a tree structure. This structure includes a requirement section A having individual requirements A-1 and A-2. A second requirements section B also appears in this tree having individual requirements B-1 and B-2. This is a master list 602 of requirements that may be owned by a project leader.

Figure 6B:
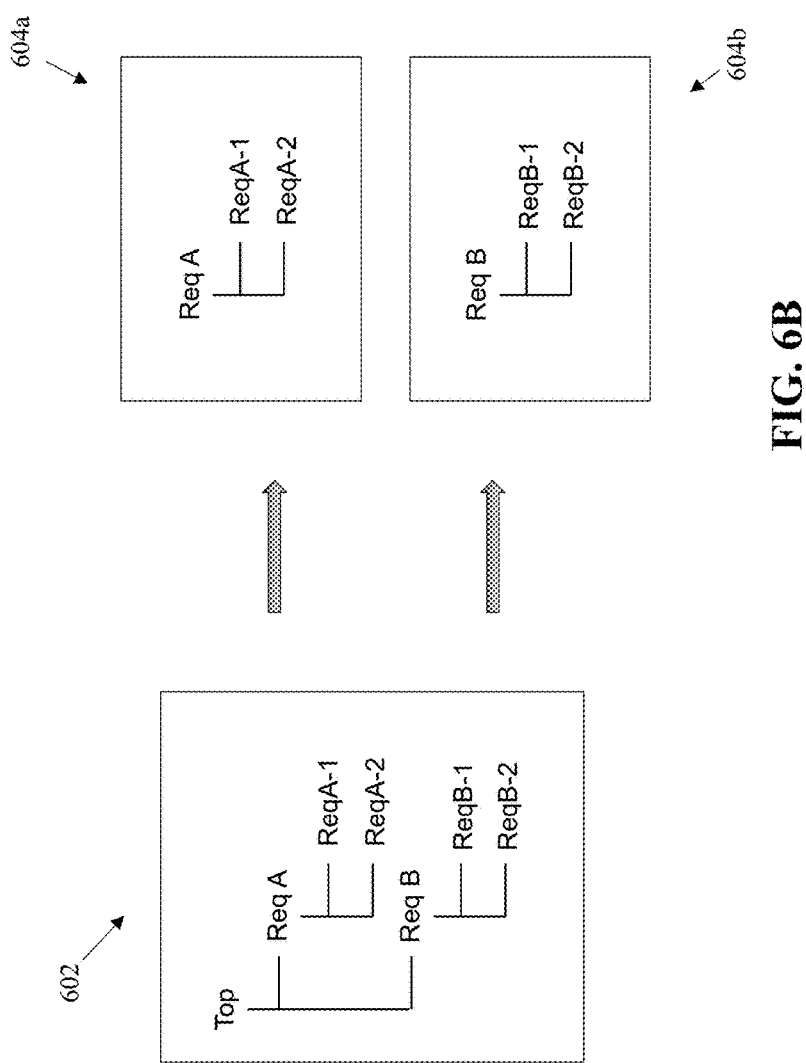
Figure 6C:
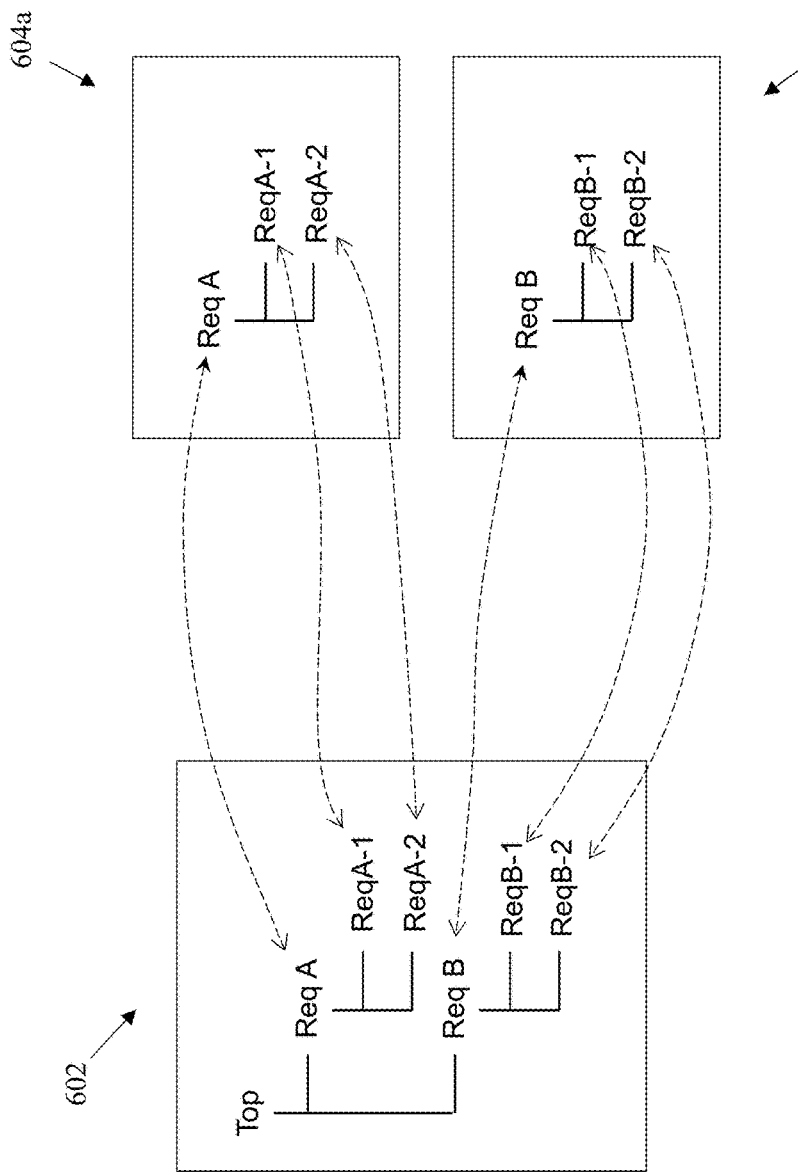

FIG. 6B illustrates the master list 602 divided into two smaller portions 604a and 604b. Each of these smaller portions 604a and 604b can be assigned by the project leader to an individual user. As illustrated in FIG. 6C, internal referencing is made between the different sets of data to cross-link the requirements within the smaller portions 604a and 604b to their corresponding entry in the master list 602 of requirements.

Figure 6D:
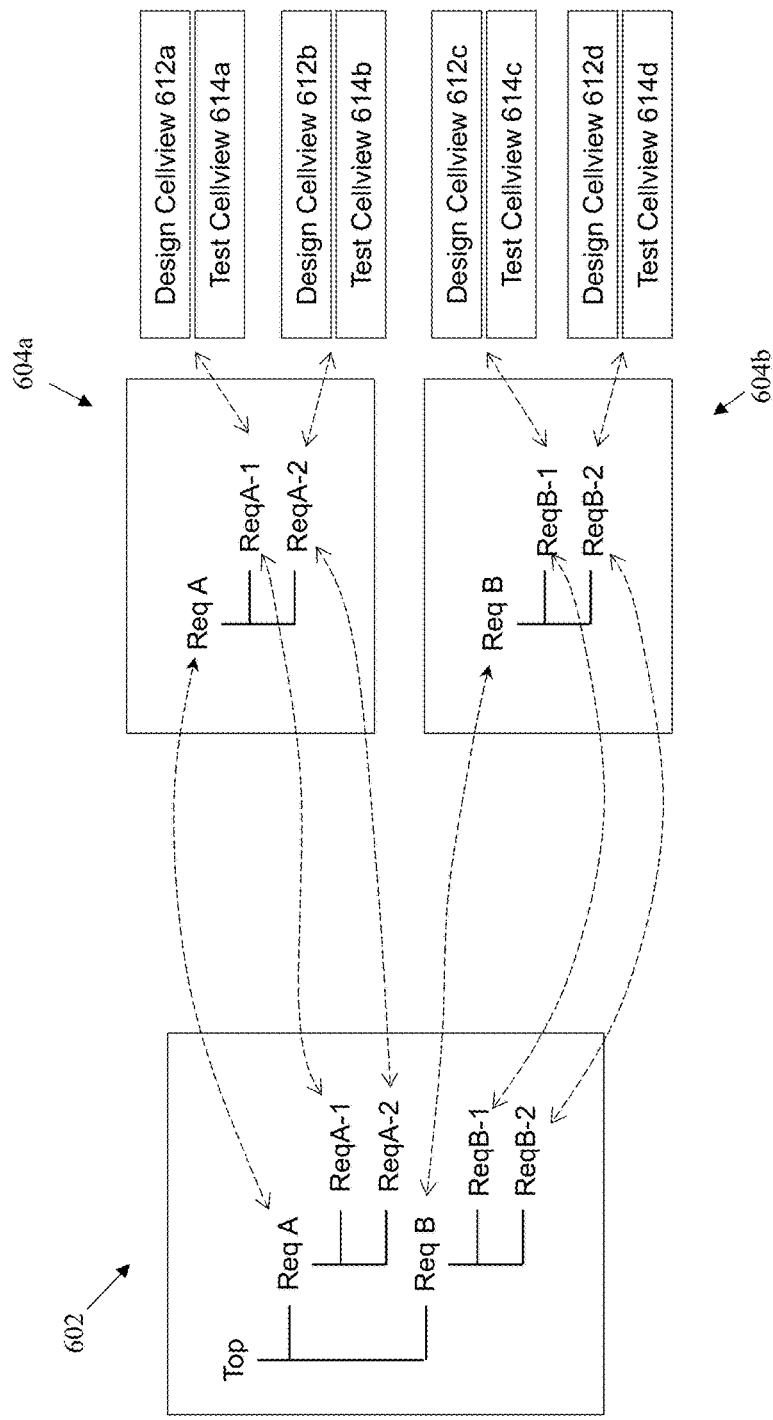

As shown in FIG. 6D, mapping is performed to correlate the requirements in sets 604a and 604b to individual cellview implementations 612a-d and 614a-d. The cross-linked between the different sets of data can be made to span the implementations as well as the requirements.

Simulations/executions can then be run individually on these sets 604a and 604b. In addition, the cross-linking permits verification plans to be executed at the higher level of the master list 602. In this way, individual users can make progress on their individual sets of requirements, while still allowing the overall project to be verified as well. This collaborative process therefore permits verification to be performed at any level of granularity as required to proceed with the project.

In some embodiments, reporting can also be performed at any level of granularity. This means that reporting of results can be made at the level of the smaller sets 604a and 604b. In addition, dynamic reporting can be made by cross referencing other files and/or cellviews between the smaller sets 604a-b or at the level of the master set 602.

Some embodiments pertain to an approach to perform incremental simulations. This permits the system to avoid re-simulating portions of the plan/design that have not changed since the last simulation.

Figure 7:
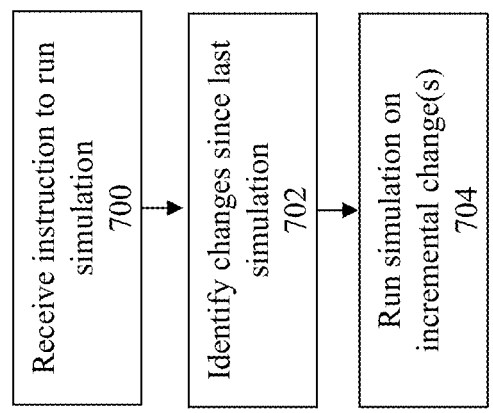
FIG. 7 shows a flowchart of an approach to implement incremental simulations.

FIG. 7 shows a flowchart of an approach to implement this embodiment of the invention. At 700, an instruction is received to run a simulation. At 702, the system checks for any changes that may have occurred since the last simulation was run. This may be accomplished in any number of ways. For example on approach is to check date stamps of the simulation setup that will be run compared to the information for the date stamps used in a previous run. Alternatively, instead of or in addition to checking date stamps, version numbers can also be checked.

At 704, simulation is incrementally run only on the changed portions. Therefore, the only portions that need to be re-executed are the portions that have been identified as being changed. This can significantly reduce the number of simulations run (e.g., in a nightly regression runs) and allows longer simulations to be run to detect more verification failures/issues sooner.

Some additional embodiments pertain to an approach to perform simulation space checking for analog verification. As part of the requirements definition, the requirements can be associated with a required space definition. This defines additional checking, e.g., based at least in part on the variable values (the 'space') that are to be varied (swept/cornered/multi-corner) over which the measurements have been made that have been checked to the required specifications. This provides another dimension to the verification process/sign off. This is very specific to analog verification and does not directly correlate to methods on digital verification.

Yet another embodiment allows users to define the system to dynamically tweak an existing simulation setup after it is loaded but before it is run. This enables flexibility and improves re-use of the plan and the various setup configurations. In this embodiment, the same cellview is used with interactively setup and independently saved deltas. For example, this approach may be applicable to configurations, variables, and/or setup state changes.

This approach is very useful when the same test bench can be re-used to operate the design in various different 'variable value' controlled modes. This would normally require copies of the test bench to be used with minor differences.

Some embodiments provide for language driven control documentation generation. In this embodiment, the structure and/or format of generated HTML documents can be configured using a set of scripts and/or APIs (e.g., SKILL APIs) to access the plan runs and resulting data, and to format that data as needed as configurable HTML tables.

As noted above, verification can be performed by running one or more verification plans. Workflow-based flows can be defined, where the flows correspond to interactions between multiple tasks pertaining to the requirements/cellviews. This permits advanced flow control for the verification plans involving controlled execution paths, conditionals, and/or looping behavior for the runs.

Figure 8:
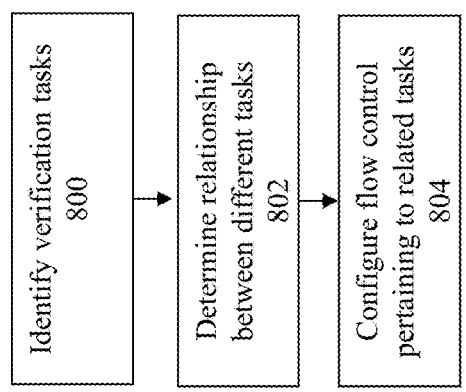
FIG. 8 shows a flowchart of an approach to implement flow controls.

FIG. 8 shows a flowchart of an approach to implement this embodiment of the invention. At 800, one or more verification tasks are identified. Such tasks include, for example, any of the items to be run as shown in FIG. 3D.

At 802, relationships are identified between the different identified tasks. For example, this action may identify a specific ordering or sequence between different tasks. This action may also identify any dependencies between the different tasks, as well as any conditions that apply to the running of one or more of the tasks (particularly if it relates to conditions that rely upon results from other tasks).

Thereafter, at 804, flow controls are configured for the tasks. This may be implemented, for example, by configuring one or more workflows that include nodes corresponding to each of the tasks to be executed.

Figure 9A:
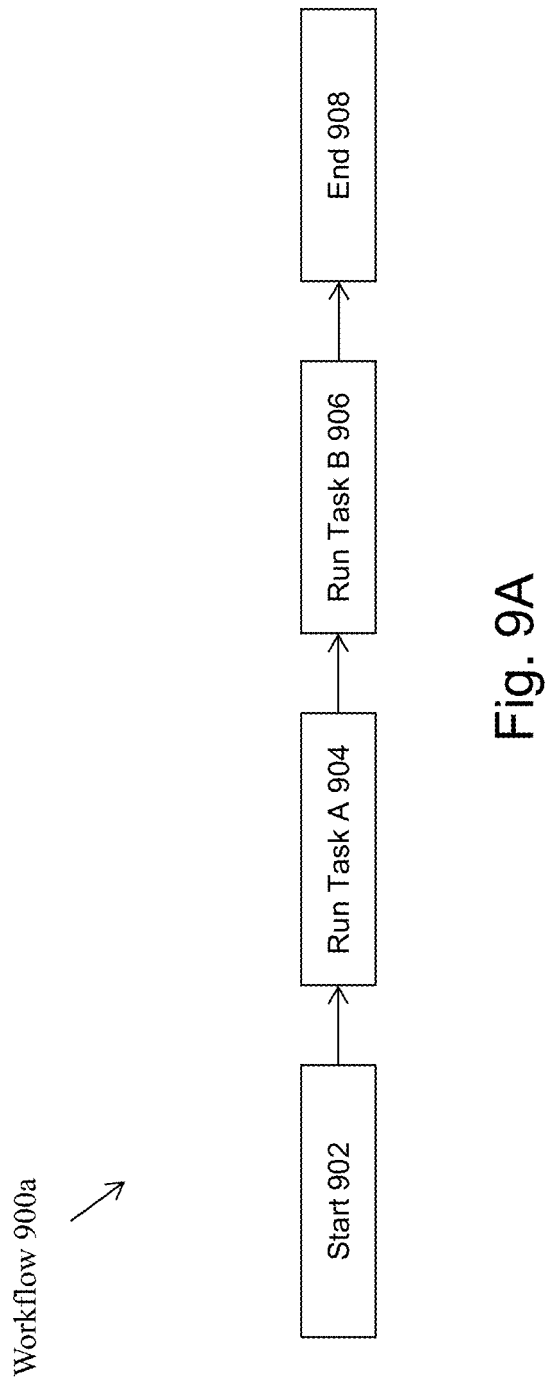
FIGS. 9A-C illustrate approaches to implement flow controls.

FIG. 9A illustrates a workflow 900a pertaining to two tasks—Task A and Task B. Assume that the relationship between Tasks A and B have been identified as requiring Task A to run before Task B. This may occur, for example, if the execution of Task B is reliant upon the results from Task A. Workflow 900a includes a starting stage 902 that begins the verification flow. Stage 904 corresponds to the execution of Task A, which is followed by stage 906 corresponding to the execution of Task B. Stage 908 identifies the end of the workflow.

Figure 9B:
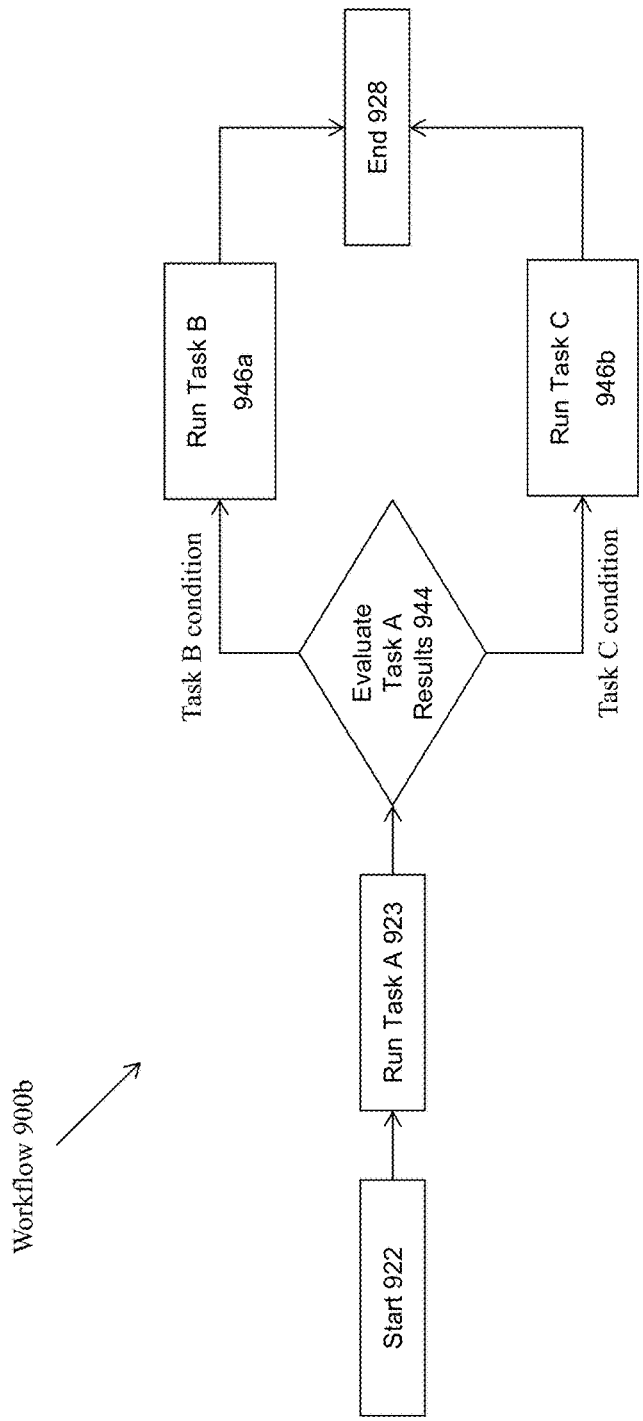

FIG. 9B illustrates another example workflow 900b which includes a conditional stage. A conditional stage operates by identifying processing paths which are conditioned or premised upon the occurrence or resolution of a condition. In the current workflow, the decisions to execute Task B or Task C is conditioned upon the results of running Task A. Workflow 900b includes a starting stage 922 that begins the verification flow. This is followed by stage 923 to execute Task A.

A conditional stage 944 exists to evaluate the results from running Task A. These results are evaluated to resolve the conditional stage 944 to identify whether the Task B path or the Task C path should be taken. If the condition resolves to the Task B path, then stage 946a is run to execute task B. On the other hand, if the condition resolves to the Task C path, then stage 946b is run to execute task C. Stage 928 identifies the end of the workflow.

Figure 9C:
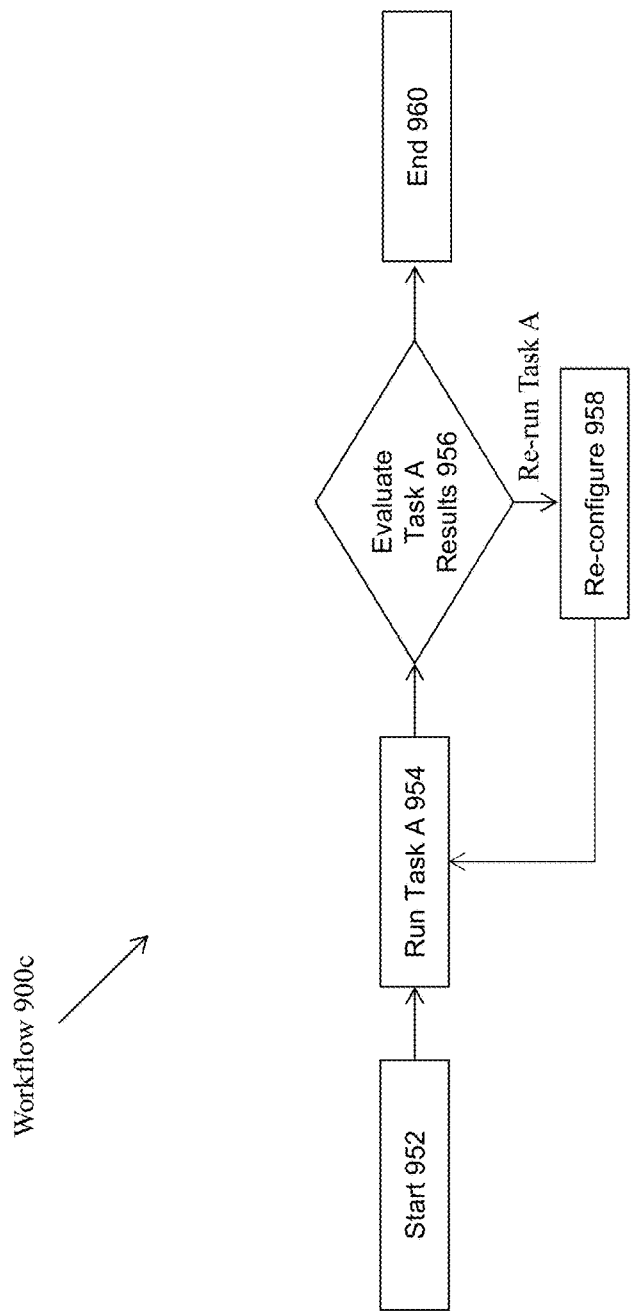

Looping behaviors can also be configured for the workflows. FIG. 9C illustrates an example workflow 900c which includes a looping conditional. Here, the workflow includes a stage 954 to run Task A. A conditional stage 956 exists to evaluate the results from running Task A and to determine whether the task needs to be re-run (e.g., because of certain results that may be deemed to be unsatisfactory). If the condition resolves to a decision to re-run Task A, then the workflow proceeds to stage 958 to perform any required reconfigurations. The workflow then loops back to stage 954 to re-run Task A.

Therefore, what has been described is an approach to implement a requirements-driven analog verification flow. Embodiments of the invention allow disparate islands of verification tasks performed with individual cellviews to be set into an overarching and closed loop verification flow context for a project or a complex verification task. A formal mechanism/system is provided for capturing/importing abstract analog verification requirements, where mapping is performed from the requirement to detailed analog verification implementations. This approach encapsulates complex cell based analog and mixed signal verification methods into a single script that can be easily used by digital verification groups.

An archive of design behavior variations and pass/fail from verification runs can be preserved with visualization and searches to analyze trends and history of fail/pass conditions. A user interface can be provided that displays the verification results in context with the initial requirements, which enables a formalized top down closed loop analog and mixed signal verification flow that: (a) captures abstract analog verification requirements; (b) connects requirements and implementations; (c) executes the verification tasks; (d) permits review of the results; and (e) closes the loop by modifications to the requirements plan and/or the implementations.

Some additional embodiments advantageously allow for requirements to be distributed to different users with dynamic monitoring of requirements in the whole plan by cross referencing status information. Some embodiments provide for dynamic reconfiguration of simulation setups for maximum reuse and minimal setup duplication for reduced maintenance overhead. Additional embodiments allow for language driven report generation by smart searches of the run and result data to create formatted tables of design behavior information.

System Architecture Overview

Figure 10:
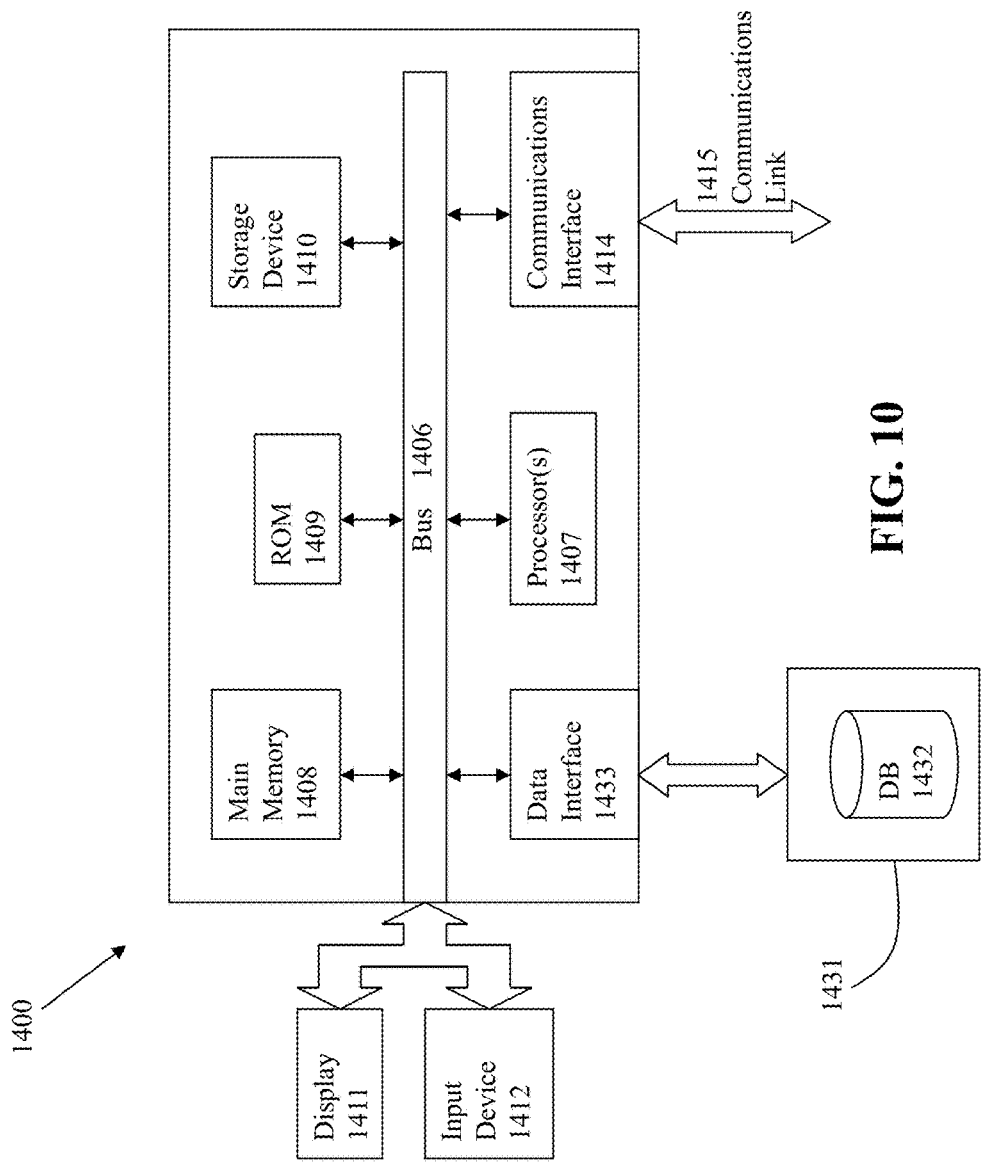
FIG. 10 shows an architecture of an example computing system with which the invention may be implemented.

FIG. 10 is a block diagram of an illustrative computing system 1400 suitable for implementing an embodiment of the present invention. Computer system 1400 includes a bus 1406 or other communication mechanism for communicating information, which interconnects subsystems and devices, such as processor 1407, system memory 1408 (e.g., RAM), static storage device 1409 (e.g., ROM), disk drive 1410 (e.g., magnetic or optical), communication interface 1414 (e.g., modem or Ethernet card), display 1411 (e.g., CRT or LCD), input device 1412 (e.g., keyboard), and cursor control.

According to one embodiment of the invention, computer system 1400 performs specific operations by processor 1407 executing one or more sequences of one or more instructions contained in system memory 1408. Such instructions may be read into system memory 1408 from another computer readable/usable medium, such as static storage device 1409 or disk drive 1410. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

The term "computer readable medium" or "computer usable medium" as used herein refers to any medium that participates in providing instructions to processor 1407 for execution. Such a medium may take many forms, including but not limited to, non-volatile media and volatile media. Non-volatile media includes, for example, optical or magnetic disks, such as disk drive 1410. Volatile media includes dynamic memory, such as system memory 1408. A database 1432 may be accessed in a computer readable medium 1431 using a data interface 1433.

Common forms of computer readable media includes, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 1400. According to other embodiments of the invention, two or more computer systems 1400 coupled by communication link 1415 (e.g., LAN, PTSN, or wireless network) may perform the sequence of instructions required to practice the invention in coordination with one another.

Computer system 1400 may transmit and receive messages, data, and instructions, including program, i.e., application code, through communication link 1415 and communication interface 1414. Received program code may be executed by processor 1407 as it is received, and/or stored in disk drive 1410, or other non-volatile storage for later execution.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

What is claimed is:

1. A method for verifying an electronic circuit design, comprising:
   identifying or defining requirements from one or more storage devices for the electronic circuit design;
   defining one or more cellviews pertaining to one or more portions of the electronic circuit design;
   mapping the requirements to the one or more cellviews;
   identifying a change in the electronic design, in the requirements, or in a verification plan for verifying the electronic design;
   running, at a verification tool comprising one or more simulation engines and functioning in tandem with at least one microprocessor, verifications for mapped implementations of the one or more cellviews that correspond to the change at least by executing the verifications while avoiding re-executing the verifications on an unchanged portion that has not changed in the electronic design, in the requirements, or in the verification plan between a current verification and a previous verification that has been executed; and
   analyzing results from running the verifications.

2. The method of claim 1, wherein identifiers of requirements for the verifications are mapped between the requirements and the one or more cellviews.

3. The method of claim 1, wherein a verification plan is defined and is run to verify the electronic circuit design, and the one or more portions of the electronic circuit design comprise at least an analog portion.

4. The method of claim 1, wherein at least identifying the requirements, mapping the requirements, running the verifications, and analyzing the results are performed iteratively.

5. The method of claim 1, wherein a graphical interface is provided for verifying an electronic circuit design.

6. The method of claim 1, wherein a script is employed for verifying an electronic circuit design.

7. The method of claim 1, further comprising:
   identifying a master set of the requirements;
   dividing the master set into smaller portions;
   processing the smaller portions; and
   maintaining cross links between the master set and the smaller portions.

8. The method of claim 1, wherein formal verification is performed to incrementally re-run only portions that have changed in the electronic design, in the requirements, or in a verification plan between a verification run and a previous verification run of the verifications.

9. The method of claim 1, further comprising performing simulation space checking based at least in part upon one or more variable values that vary over a simulation space corresponding to the requirements.

10. The method of claim 1, further comprising:
    dynamically reconfiguring a verification setup for at least one verification of the verifications after the verification setup is loaded but before the at least one verification is executed.

11. A computer program product that includes a computer readable medium, the computer readable medium comprising a plurality of computer instructions which, when executed by a processor, cause the processor to execute a method for verifying an electronic circuit design, the process comprising:
    identifying or defining requirements from one or more storage devices for the electronic circuit design;
    defining one or more cellviews pertaining to one or more portions of the electronic circuit design;
    mapping the requirements to the one or more cellviews;
    identifying a change in the electronic design, in the requirements, or in a verification plan for verifying the electronic design;
    running, at a verification tool comprising one or more simulation engines and functioning in tandem with at least one microprocessor, verifications for mapped implementations of the one or more cellviews that correspond to the change at least by executing the verifications while avoiding re-executing the verifications on an unchanged portion that has not changed in the electronic design, in the requirements, or in the verification plan between a current verification and a previous verification that has been executed; and
    analyzing results from running the verifications.

12. The computer program product of claim 11, wherein identifiers of requirements for the verifications are mapped between the requirements and the one or more cellviews.

13. The computer program product of claim 11, wherein the computer readable medium further comprises additional computer instructions which, when executed by the processor, cause the processor to execute:
    identifying a master set of the requirements;
    dividing the master set into smaller portions;
    processing the smaller portions; and
    maintaining cross links between the master set and the smaller portions.

14. The computer program product of claim 11, wherein a verification plan is defined and is run to verify the electronic circuit design, and the one or more portions of the electronic circuit design comprise at least an analog portion.

15. The computer program product of claim 11, wherein the computer readable medium further comprises additional computer instructions which, when executed by the processor, cause the processor to execute:
    dynamically reconfiguring a verification setup for at least one verification of the verifications after the verification setup is loaded but before the at least one verification is executed.

16. A system for processing an electronic circuit design, comprising:
    a memory comprising a storage structure to store a plurality of computer instructions; and
    a processor, wherein the processor is configured to execute the plurality of instructions to verify an electronic design at least by
       identifying or defining requirements from one or more storage devices for the electronic circuit design,
       defining one or more cellviews pertaining to one or more portions of the electronic circuit design,
       mapping the requirements to the one or more cellviews,
       identifying a change in the electronic design, in the requirements, or in a verification plan for verifying the electronic design;
       running verifications for mapped implementations of the one or more cellviews that correspond to the change at least by executing the verifications while avoiding re-executing the verifications on an unchanged portion that has not changed in the electronic design, in the requirements, or in the verification plan between a current verification and a previous verification that has been executed, and
       analyzing results from running the verifications.

17. The system of claim 16, wherein identifiers of requirements for the verifications are mapped between the requirements and the one or more cellviews.

18. The system of claim 16, wherein a verification plan is defined and is run to verify the electronic circuit design, and the one or more portions of the electronic circuit design comprise at least an analog portion.

19. The system of claim 16, wherein the memory further comprises additional computer instructions which, when executed by the processor, cause the processor to execute:
identifying a master set of the requirements;
dividing the master set into smaller portions;
processing the smaller portions; and
maintaining cross links between the master set and the smaller portions.

20. The system of claim 16, wherein the memory further comprises additional computer instructions which, when executed by the processor, cause the processor to execute:
dynamically reconfiguring a verification setup for at least one verification of the verifications after the verification setup is loaded but before the at least one verification is executed.

* * * * *